(12) United States Patent
Kindo

(10) Patent No.: US 9,299,652 B2
(45) Date of Patent: Mar. 29, 2016

(54) DEVICE AND METHOD OF MANUFACTURING THE SAME

(71) Applicant: PS5 LUXCO S.A.R.L., Luxembourg (LU)

(72) Inventor: Osamu Kindo, Tokyo (JP)

(73) Assignee: PS5 LUXCO S.A.R.L., Luxembourg (LU)

( * ) Notice: Subject to any disclaimer, the term of this patent is extended or adjusted under 35 U.S.C. 154(b) by 0 days.

(21) Appl. No.: 14/422,352

(22) PCT Filed: Aug. 20, 2013

(86) PCT No.: PCT/JP2013/072638
§ 371 (c)(1),
(2) Date: Feb. 18, 2015

(87) PCT Pub. No.: WO2014/030760
PCT Pub. Date: Feb. 27, 2014

(65) Prior Publication Data
US 2015/0221587 A1 Aug. 6, 2015

(30) Foreign Application Priority Data
Aug. 23, 2012 (JP) .................... 2012-184223

(51) Int. Cl.
*H01L 23/48* (2006.01)
*H01L 23/498* (2006.01)
(Continued)

(52) U.S. Cl.
CPC .... *H01L 23/49838* (2013.01); *B29C 45/14655* (2013.01); *B29C 45/2669* (2013.01);
(Continued)

(58) Field of Classification Search
CPC ... H01L 25/0657; H01L 23/02; H01L 23/055; H01L 23/28; H01L 23/4821; H01L 25/112; H01L 2225/06503; H01L 2225/0651
USPC .......... 257/777, E25.006, E25.021, E25.027, 257/E23.085, 787, E23.124, E23.128
See application file for complete search history.

(56) References Cited

U.S. PATENT DOCUMENTS 6,445,594 B1 * 9/2002 Nakagawa et al. .......... 361/776
8,531,021 B2 * 9/2013 Hu et al. ..................... 257/686
(Continued)

FOREIGN PATENT DOCUMENTS

JP 11-097586 A 4/1999
JP 2005-203439 A 7/2005
(Continued)

OTHER PUBLICATIONS

International Search Report dated (ISR) (PCT Form PCT/ISA/210), in PCT/JP2013/072638, dated Aug. 28, 2012Oct. 29, 2013.

*Primary Examiner* — Jasmine Clark
(74) *Attorney, Agent, or Firm* — Kunzler Law Group

(57) ABSTRACT

A device includes a substrate having a base member and an insulation film formed on a surface of the base member, a first semiconductor chip mounted over a surface of the substrate on which the insulation film are formed, a second semiconductor chip stacked over the first semiconductor chip so that an overhang portion is formed, and a sealing member formed on the substrate so that the first semiconductor chip and the second semiconductor chip are covered with the sealing member. The insulation film has a first opening portion in a first area of the substrate that overlaps the overhang portion. The base member has an air passage communicating with the first opening portion.

17 Claims, 9 Drawing Sheets

(51) Int. Cl.
*H01L 23/31* (2006.01)
*H01L 21/56* (2006.01)
*H01L 23/00* (2006.01)
*H01L 25/065* (2006.01)
*B29C 45/26* (2006.01)
*B29C 45/34* (2006.01)
*B29C 45/14* (2006.01)

(52) U.S. Cl.
CPC .............. *B29C45/34* (2013.01); *H01L 21/561* (2013.01); *H01L 21/565* (2013.01); *H01L 23/3128* (2013.01); *H01L 23/3142* (2013.01); *H01L 24/17* (2013.01); *H01L 24/49* (2013.01); *H01L 24/97* (2013.01); *H01L 25/0657* (2013.01); *B29C 45/14311* (2013.01); *B29C 2045/14327* (2013.01); *H01L 24/45* (2013.01); *H01L 24/48* (2013.01); *H01L 2224/16145* (2013.01); *H01L 2224/16225* (2013.01); *H01L 2224/2919* (2013.01); *H01L 2224/32145* (2013.01); *H01L 2224/32225* (2013.01); *H01L 2224/45139* (2013.01); *H01L 2224/45144* (2013.01); *H01L 2224/48145* (2013.01); *H01L 2224/48227* (2013.01); *H01L 2224/48228* (2013.01); *H01L 2224/49175* (2013.01); *H01L 2224/73253* (2013.01); *H01L 2224/73265* (2013.01); *H01L 2224/92247* (2013.01); *H01L 2224/97* (2013.01); *H01L 2225/0651* (2013.01); *H01L 2225/06506* (2013.01); *H01L 2225/06517* (2013.01); *H01L 2225/06555* (2013.01); *H01L 2225/06558* (2013.01); *H01L 2225/06562* (2013.01); *H01L 2924/00014* (2013.01); *H01L 2924/15151* (2013.01); *H01L 2924/15311* (2013.01); *H01L 2924/18301* (2013.01)

(56) References Cited

U.S. PATENT DOCUMENTS

2008/0136006 A1  6/2008  Jang et al.
2011/0291244 A1  12/2011  Takeshima

FOREIGN PATENT DOCUMENTS

| | | |
|---|---|---|
| JP | 2008-084971 A | 4/2008 |
| JP | 2011-253900 A | 12/2011 |
| JP | 2012-064983 A | 3/2012 |
| KR | 10-2008-0053233 A | 6/2008 |
| TW | 200834873 A | 8/2008 |

* cited by examiner

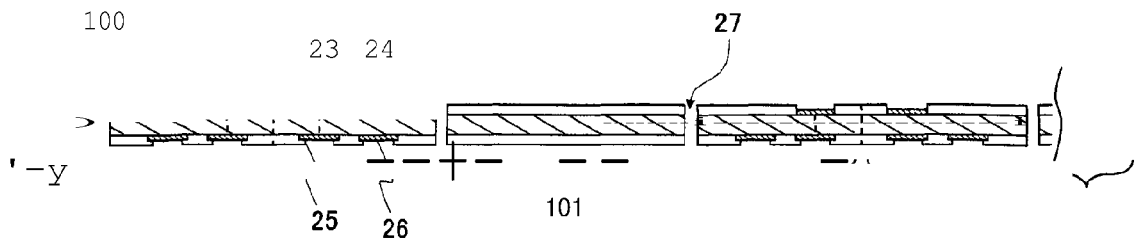
FIG. 3A
FIG. 3B
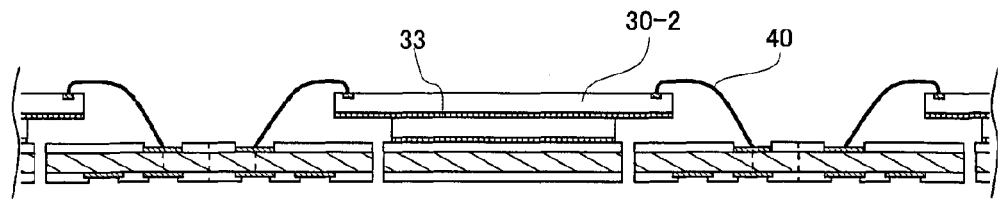
FIG. 3C
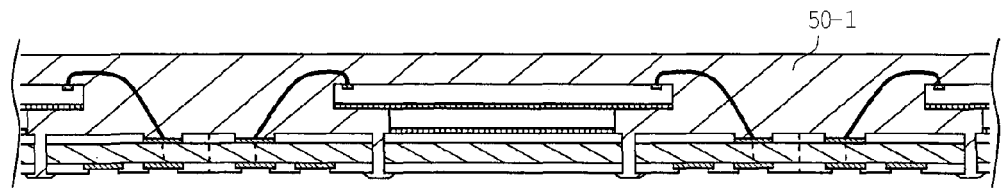
FIG. 3D
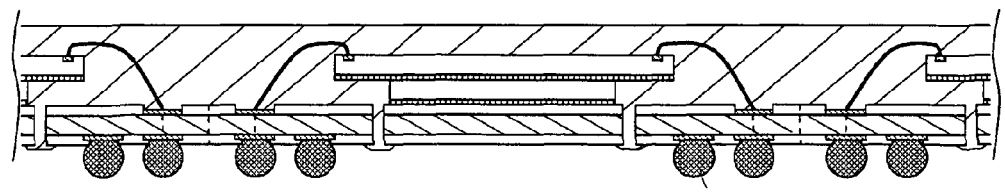
FIG. 3E
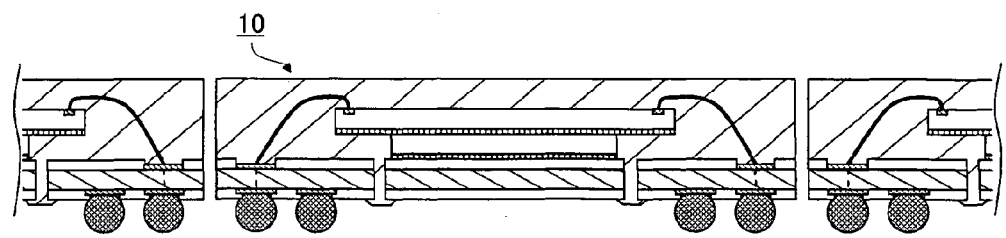
FIG. 3F

DEVICE AND METHOD OF MANUFACTURING THE SAME

TECHNICAL FIELD

The present invention relates to a semiconductor device and a method of manufacturing the same.

BACKGROUND ART

JP-A 2011-253900 (Reference 1) discloses a multi-chip package (MCP) semiconductor device having a wiring substrate, a first semiconductor chip mounted on the wiring substrate, and a second semiconductor chip stacked on the first semiconductor chip so that an overhang portion is formed. In this semiconductor device, an insulation film formed on a surface of the wiring substrate is removed from a region of the wiring substrate that faces the overhand portion.

Furthermore, JP-A 6-326211 (Reference 2) discloses a semiconductor package having a circuit board and a semiconductor chip mounted on the circuit board in a face-down manner. A through hole is formed in a portion of the circuit board on which the semiconductor chip has been mounted. JP-A 11-97586 (Reference 3) also discloses a similar configuration to Reference 2.

DISCLOSURE OF INVENTION

According to demands for size reduction and thickness reduction of portable devices, the thickness of semiconductor devices or semiconductor chips mounted on such portable devices have increasingly been reduced. As the thickness of semiconductor chips of a MCP semiconductor device is reduced, a gap between an overhang portion of an upper semiconductor chip and a wiring substrate becomes narrowed by thickness reduction of a lower semiconductor chip.

With the method of increasing a gap as disclosed in Reference 1, a gap cannot be increased more than the thickness of an insulation film. If the thickness of semiconductor chips is further to be reduced for future development, it may be impossible to prevent or suppress generation of voids under an overhang portion upon resin sealing.

Reference 2 or 3 fails to teach or suggest any problems in MCP semiconductor devices.

In one embodiment, there is provided a device that includes a substrate having a base member and an insulation film formed on a surface of the base member. A first semiconductor chip is mounted over a surface of the substrate on which the insulation film is formed. A second semiconductor chip is stacked over the first semiconductor chip so that an overhang portion is formed. A sealing member is formed on the substrate so that the first semiconductor chip and the second semiconductor chip are covered with the sealing member. The insulation film has a first opening portion in a first area of the substrate that overlaps the overhang portion. The base member has an air passage communicating with the first opening portion.

In another embodiment, there is provided a device that includes a substrate including an upper surface and an air passage. A part of the air passage is exposed from the upper surface. A first semiconductor chip is mounted over the upper surface of the substrate. The first semiconductor chip is arranged near the part of the air passage. A second semiconductor chip is stacked over the first semiconductor chip so as to cover the part of the air passage in plan view. A sealing member is provided over the upper surface of the substrate to cover the first semiconductor chip and the second semiconductor chip.

In still another embodiment, there is provided a device includes a substrate including an upper surface, a lower surface opposite to the upper surface and a through hole penetrated from the upper surface to the lower surface. A first semiconductor chip is mounted over the upper surface of the substrate. The first semiconductor chip is arranged near the through hole without covering the through hole with the first semiconductor chip. A second semiconductor chip is stacked over the first semiconductor chip. The second semiconductor chip includes a overhang portion that is protruded from the first semiconductor chip so as to cover the through hole in plan view. A sealing resin is provided over the upper surface of the substrate to cover the first semiconductor chip and the second semiconductor chip. The through hole is filled with the sealing resin.

BRIEF DESCRIPTION OF DRAWINGS

The above features and advantages of the present invention will be more apparent from the following description of certain preferred embodiments taken in conjunction with the accompanying drawings, in which:

FIGS. 3A to 3F are cross-sectional views explanatory of a manufacturing process of the semiconductor device shown in FIGS. 1A and 1B;

DETAILED DESCRIPTION OF EXEMPLARY EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Figure 1A:
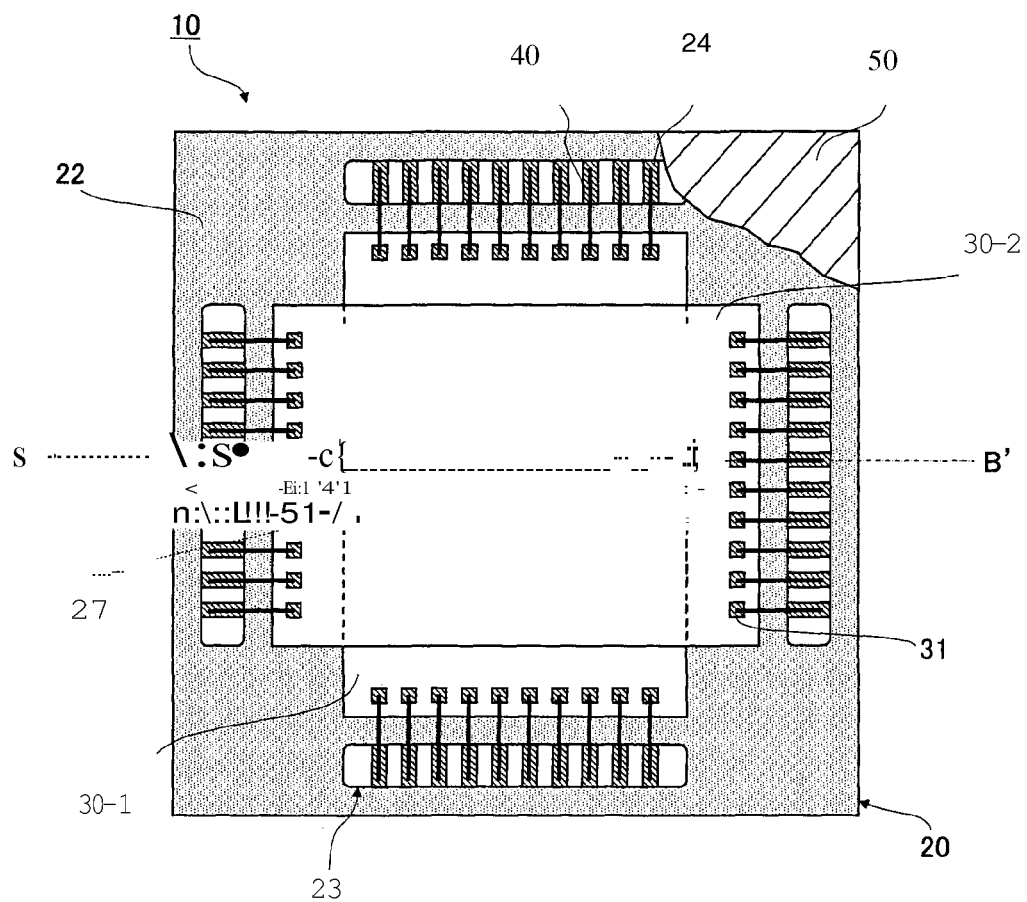
FIG. 1A is a plan view showing an outlined configuration of a semiconductor device according to a first embodiment of the present invention.
Figure 1B:
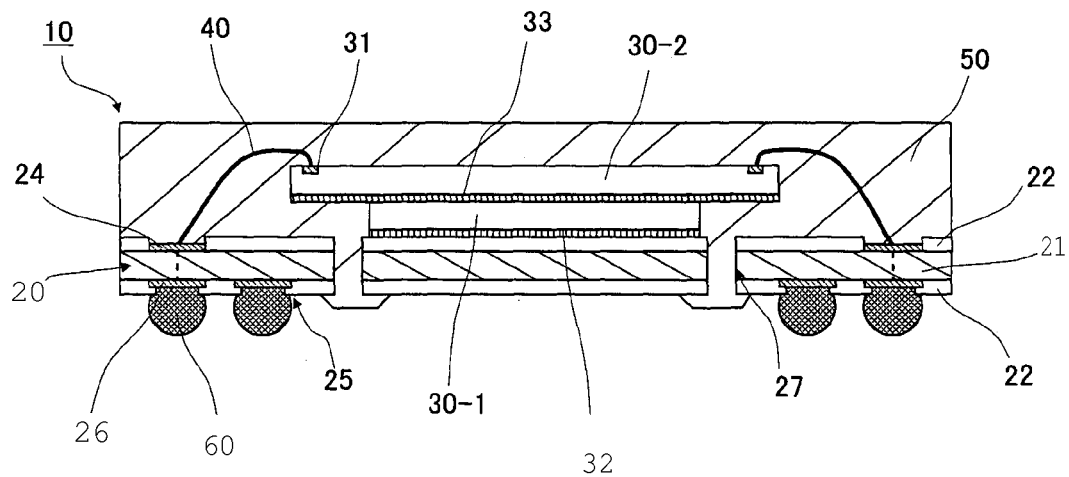
FIG. 1B is a cross-sectional view taken along 8-8' of FIG. 1A.

FIG. 1A is a plan view showing an outlined configuration of a semiconductor device 10 according to a first embodiment of the present invention, and FIG. 1B is a cross-sectional view taken along B-B' of FIG. 1A. In FIG. 1A, most part of a sealing member 50 is omitted from the illustration.

The illustrated semiconductor device 10 is a multi-chip package (MCP) semiconductor device in which a plurality of semiconductor chips (a first semiconductor chip 30-1 and a second semiconductor chip 30-2 in this example) are stacked on and mounted on a wiring substrate 20.

For example, the wiring substrate 20 is formed of a glass epoxy substrate substantially in the form of a rectangular plate. The wiring substrate 20 includes an insulating base member 21, wiring layers (not shown) patterned on both sides of the insulating base member 21, and solder resist films (insulating films) 22 formed so as to cover those wiring layers.

The solder resist film 22 formed on a first surface of the wiring substrate 20 (a surface on which the chips are mounted) has four connection pad opening portions 23 formed therein. Each of those connection pad opening portions 23 has a substantially rectangular shape extending along one of four sides of the wiring substrate 20. A plurality of connection pads 24, which are formed in the wiring layer, are exposed within the connection pad opening portions 23.

Meanwhile, the solder resist film 22 formed on a second surface of the wiring substrate 20 has a plurality of land opening portions 25 formed therein. A plurality of lands 26, which are formed in the wiring layer, are exposed within the land opening portions 25.

The first and second semiconductor chips 30-1 and 30-2 may have any circuit configuration and shape. This embodiment assumes that the semiconductor device has two memory chips having the same circuit configuration, shape, and pad arrangement. Each of the semiconductor chips is in the form of a rectangular plate and has a plurality of electrode pads 31 arranged along short sides thereof.

The first semiconductor chip 30-1, which is located at a lower side, is mounted on (or over) the first surface of the wiring substrate 20 by an adhesive member 32 (e.g., die-attached film (OAF)) in a manner (a face-up manner) in which a surface of the first semiconductor chip 30-1 on which the electrode pads 31 have been formed faces upward.

The second semiconductor chip 30-2, which is located at an upper side, is mounted on (or over) the first semiconductor chip 30-1 in a state in which it is rotated on the horizontal plane parallel to the first semiconductor chip 30-1 by 90 degrees with respect to the first semiconductor chip 30-1. The second semiconductor chip 30-2 is stacked on (or over) the first semiconductor chip 30-1 by an adhesive member 33 in a manner (a face-up manner) in which a surface of the second semiconductor chip 30-2 on which the electrode pads 31 have been formed faces upward. Opposite ends of the second semiconductor chip 30-2 in the longitudinal direction project outward from edges of the first semiconductor chip 30-1 so as to form overhang portions. In other words, short edges of the second semiconductor chip 30-2 project from long edges of the first semiconductor chip 30-1 so as to form overhang portions. A gap is formed between each of the overhang portions and the wiring substrate 20.

Vent portions 27 are formed in rectangular areas (first areas) of the wiring substrate 20 that overlaps the overhang portions. Each of the vent portions 27 includes an opening portion (first opening portion) formed in the solder resist film 22 formed on the first surface of the wiring substrate 20 and a through hole (vent passage) formed in the insulating base member 21 and the solder resist film 22 formed on the second surface of the wiring substrate 20 so as to communicate with the opening portion of the solder resist film 22 formed on the first surface of the wiring substrate 20.

Each of the vent portions 27 is formed at a central portion of the first area along the short side of the second semiconductor chip 30-2 and is located adjacent to the first semiconductor chip 30-1. In other words, each of the vent portions 27 is formed at a central portion of the first area in the longitudinal direction of the first area and located near the first semiconductor chip 30-1. Each of the vent portions 27 is formed at a location deviated outward from the location at which the first semiconductor chip 30-1 is expected to be mounted by a predetermined distance so that the vent portion 27 does not overlap the first semiconductor chip 30-1. For example, the predetermined distance is at least 75 μm.

Each of the first semiconductor chip 30-1 and the second semiconductor chip 30-2 is electrically connected to the wiring layer of the wiring substrate 20 by wires 40.

The sealing member 50 of resin is formed on the first surface of the wiring substrate 20. The first semiconductor chip 30-1 and the second semiconductor chip 30-2, as well as the wires 40, are covered with and surrounded by the sealing member 50. The sealing resin of the sealing member 50 enters gaps located below the overhang portions of the second semiconductor chip 30-2. Thus, the sealing resin is also filled in the vent portions 27 formed in the wiring substrate 20. Specifically, the vent portions 27 are filled with the sealing resin. Since the vent portions 27 are filled with the sealing resin, the adhesiveness between the wiring substrate 20 and the sealing member 50 can be improved.

The vent portions 27 have a diameter larger than a diameter of a filler included in the sealing resin so that the filler can enter the vent portions 27. The vent portions 27 preferably have a diameter that is greater than or equal to twice the diameter of the filler. For example, when the diameter of the filler is 50 μm, the diameter of the vent portions 27 are set to be 100 μm or more.

Solder balls 60 are mounted on the lands formed on the second surface of the wiring substrate 20.

As described above, the semiconductor device according to the present embodiment includes the vent portions 27 located below the overhang portions of the second semiconductor chip 30-2. Those vent portions 27 are formed near the first semiconductor chip 30-1 and at the central portion of the first area along the short sides of the second semiconductor chip 30-2. Thus, voids are prevented from being generated below the overhang portions of the second semiconductor chip 30-2 upon sealing with the resin. Therefore, the reliability of the semiconductor device 10 can be improved. Furthermore, even if narrow gaps are formed below the overhang portions of the second semiconductor chip 30-2 due to reduction in thickness of the first semiconductor chip 30-1, air can be discharged through the vent portions 27. Therefore, the semiconductor device can be reduced in thickness.

Figure 2A:
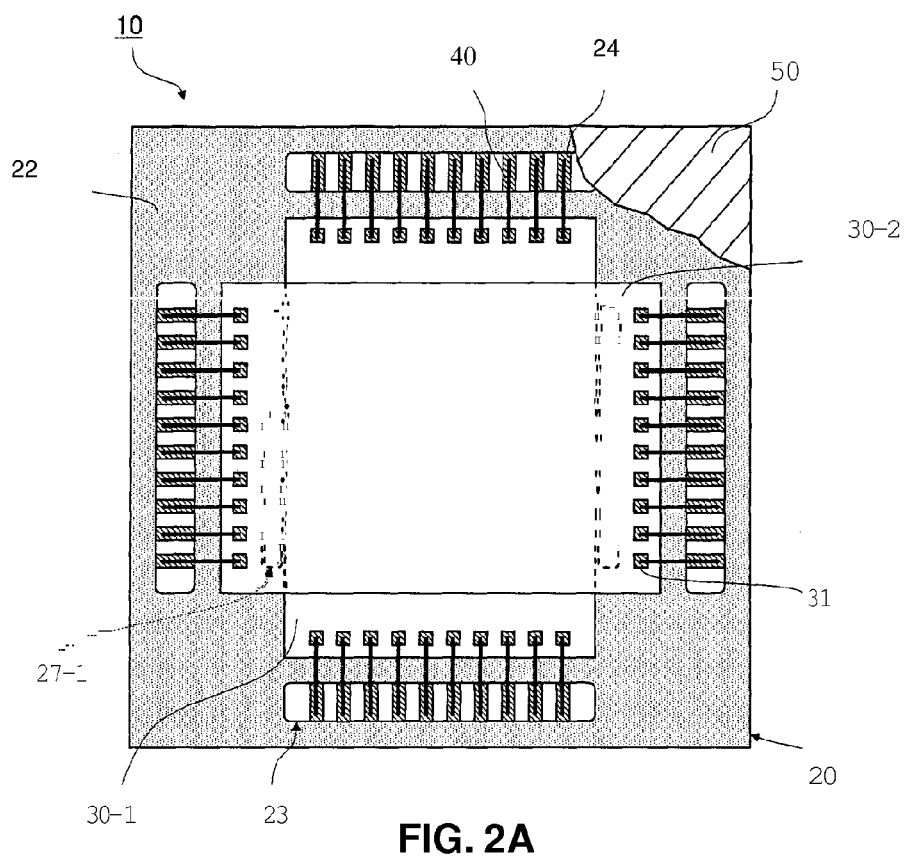
FIG. 2A is a plan view showing a variation of the semiconductor device according to the first embodiment of the present invention.
Figure 2B:
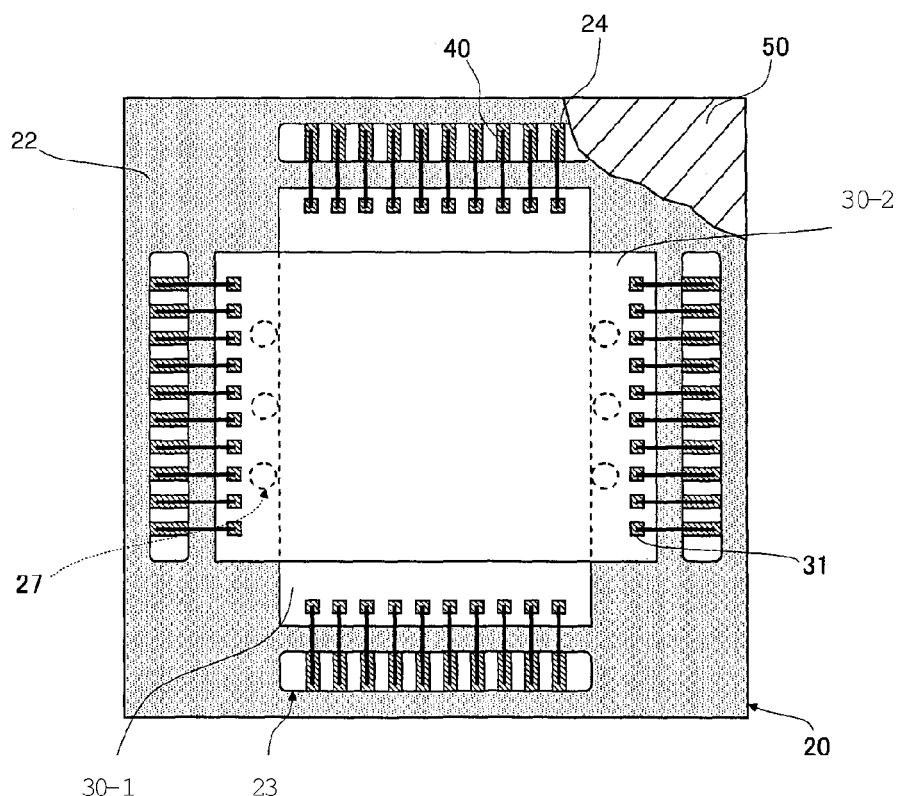
FIG. 2B is a plan view showing another variation of the semiconductor device according to the first embodiment of the present invention.

In the above embodiment, opening portions and through holes of the vent portions 27 being formed have a circular cross-section. However, the vent portions 27 may have any shape, size, and number. For example, as shown in FIG. 2A, vent portions 27-1 having a slit shape (roughly rectangular shape) may be formed. Furthermore, as shown in FIG. 2B, a plurality of vent portions 27 may be formed for each of the short sides of the second semiconductor chip 30-2. In FIGS. 2A and 2B, most part of the sealing member 50 is omitted from the illustration. In any case, the vent portions 27 or 27-1 are formed below the overhang portions of the second semiconductor chip 30-2 and near the first semiconductor chip 30-1. In the case where the vent portions have a slit shape, the (minimum) width of the vent portions is set to be, for example, greater than or equal to twice the diameter of the filler.

Next, a manufacturing process of a semiconductor device according to the first embodiment will be described with reference to FIGS. 3A to 5C.

Figure 4A:
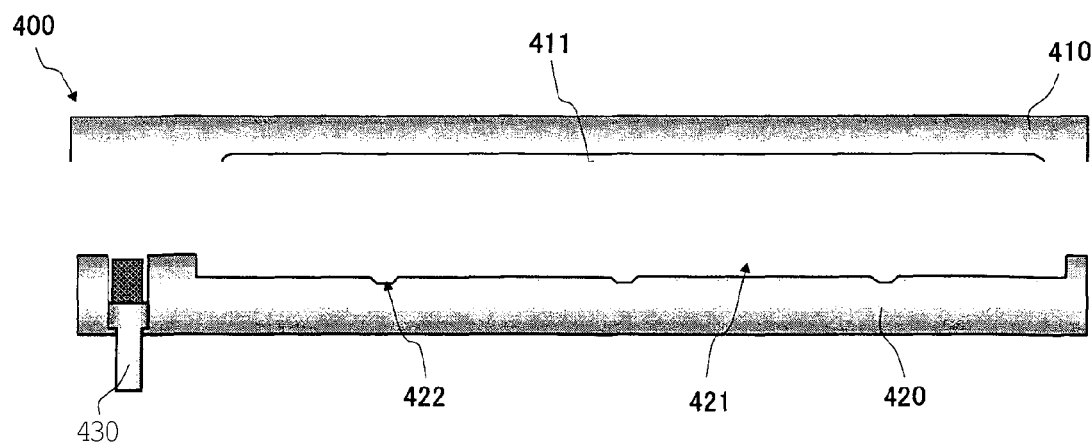
FIGS. 4A to 4D are cross-sectional views explanatory of a molding process of FIG. 3D.
Figure 5A:
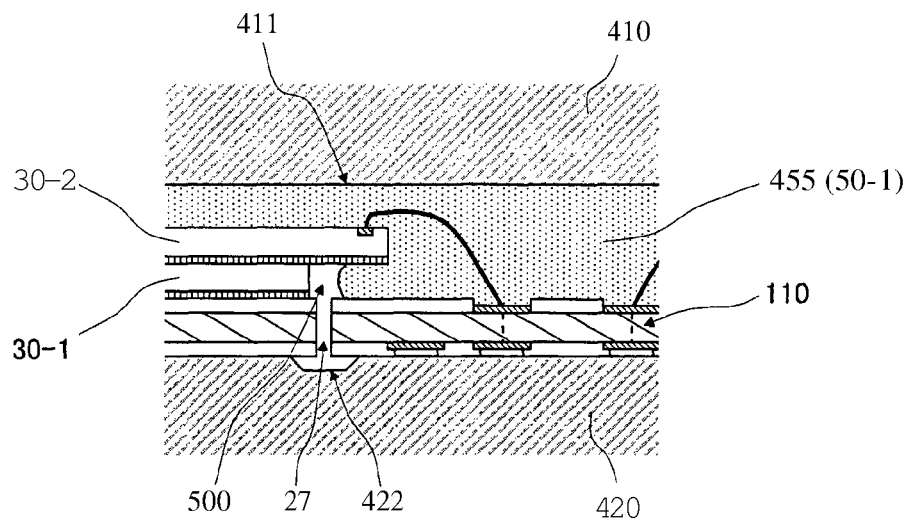
FIGS. 5A to 5C are enlarged views of a primary portion of the semiconductor device for explaining a filling process of FIG. 4C.
Figure 5B:
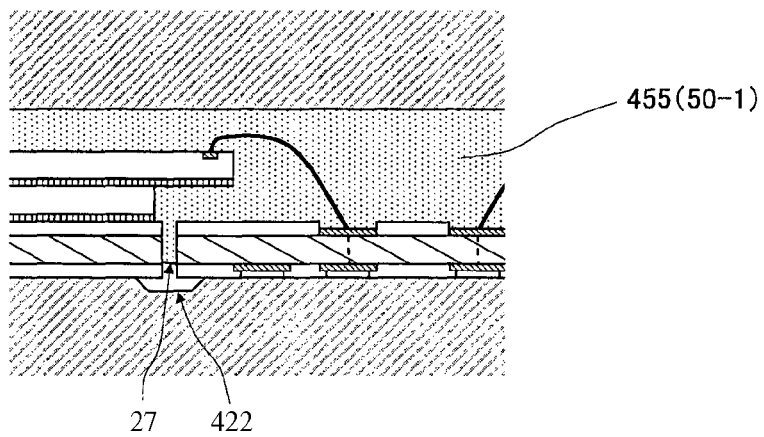
Figure 5C:
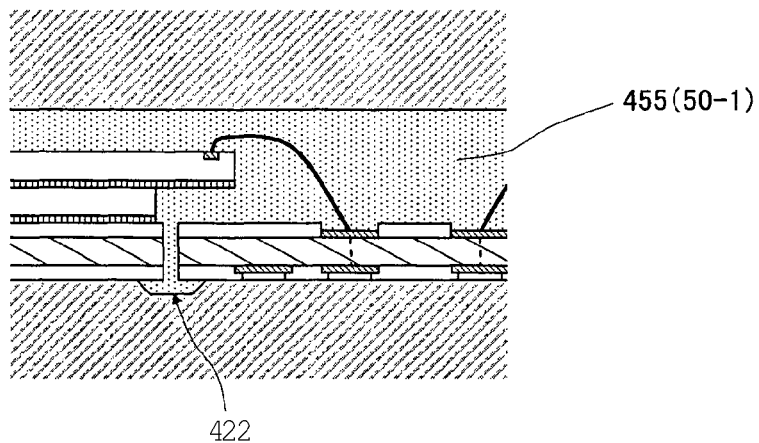

FIGS. 3A to 3F are cross-sectional views explanatory of an assembly flow of a semiconductor device according to the present embodiment. FIGS. 4A to 4O is are cross-sectional views explanatory of a mold process of FIG. 3D. FIGS. 5A to 5C are enlarged views of a primary portion of the semiconductor device during the mold process.

First, a base wiring substrate 100 as shown in FIG. 3A is prepared. The base wiring substrate 100 includes a plurality of product formation portions 101 arranged like a matrix. Each of the product formation portions 101 will be a wiring substrate 20 after singulation. FIG. 3A illustrates one product formation portion 101 and part of product formation portions located on both sides of the product formation portion 101.

In addition to wires (not shown), connection pads 24 exposed within connection pad opening portions 23, and lands 26 exposed within land opening portions 25, vent portions 27 are formed on each of the product formation portions 101.

The vent portions 27 are formed outside of an area on which the first semiconductor chip 30-1 is expected to be mounted. Those vent portions 27 are formed in areas expected to be located below the overhang portions of the second semiconductor chip 30-2.

Then, as shown in FIG. 3B, a first semiconductor chip 30-1 is mounted on each of the product formation portions 101 of the base wiring substrate 100 prepared. An area for the first semiconductor chip to be mounted is predetermined substantially at the center of each of the product formation portions 101. A first semiconductor chip 30-1 is mounted onto that area by using an adhesive member 32 such as a OAF. As described above, the vent portions 27 are formed at positions located away from the area for the first semiconductor chip to be mounted. Therefore, even if the first semiconductor chip 30-1 is mounted onto a deviated location, the vent portions 27 are not covered with the first semiconductor chip 30-1. Nevertheless, the vent portions 27 are located near the long sides of the first semiconductor chip 30-1.

Subsequently, as shown in FIG. 3C, a second semiconductor chip 30-2 is stacked and mounted on the first semiconductor chip 10 by using an adhesive member 33 such as a OAF. The second semiconductor chip 30-2 is mounted on the first semiconductor chip 30-1 in a state in which it is rotated by 90 degrees on a plane parallel to the first semiconductor chip 30-1. In other words, the second semiconductor chip 30-1 is stacked on the first semiconductor chip 30-1 so that the longitudinal direction of the second semiconductor chip 30-2 is perpendicular to the longitudinal direction of the first semiconductor chip 30-1. Thus, opposite short sides of the second semiconductor chip 30-2 project laterally from long edges of the first semiconductor chip 30-1 so as to form overhang portions. A vent portion 27 is formed in an area facing each of the overhang portions. It is preferable to form those vent portions 27 at locations at which voids are likely to be generated.

Specifically, it is preferable to form the vent portions 27 at locations that are below the overhang portions and near the first semiconductor chip 30-1, particularly at the central portion along the short sides of the second semiconductor chip 30-2.

Subsequently, each of the electrode pads 31 of the semiconductor chips 30-1 and 30-2 is connected to the corresponding connection pad 24 of the base wiring substrate 100 by a conductive wire 40, for example, an Au wire.

Next, as shown in FIG. 3D, a sealing member 50-1 is formed on a first surface of the base wiring substrate 100 by a batch molding process using resin. The sealing member 50-1 collectively covers all of the product formation portions 101 on the base wiring substrate 100, Thereafter, as shown in FIG. 3E, a solder ball 60 is mounted onto each of the lands 26 formed on a second surface of the base wiring substrate 100. Those solder balls 60 are used as external terminals of the semiconductor device 10.

Then the sealing member 50-1 and the base wiring substrate 100 are cut longitudinally and latitudinally by using a dicing blade (not shown). Thus, as shown in FIG. 3F, the sealing member 50-1 and the base wiring substrate 100 are divided into individual semiconductor devices 10. In this manner, the semiconductor devices 10 are completed.

Next, the batch molding process is described in more detail. For example, a transfer mold apparatus may be used for the batch molding process.

As shown in FIG. 4A, a transfer mold apparatus 400 has an upper mold 410 and a lower mold 420. The upper mold 410 has a cavity 411 formed therein. The lower mold 420 has a recessed portion 421 formed therein. The lower mold 420 also has flow cavities 422 formed in a surface of the recessed portion 421. A plunger 430 is incorporated into the lower mold 420.

First, the base wiring substrate 100 that has completed a wire bonding process is placed within the recessed portion 421 of the lower mold 420. A material tablet 440 is set onto the plunger 430. For example, the material tablet 440 is a sealing resin material such as a thermosetting epoxy resin.

Figure 4B:
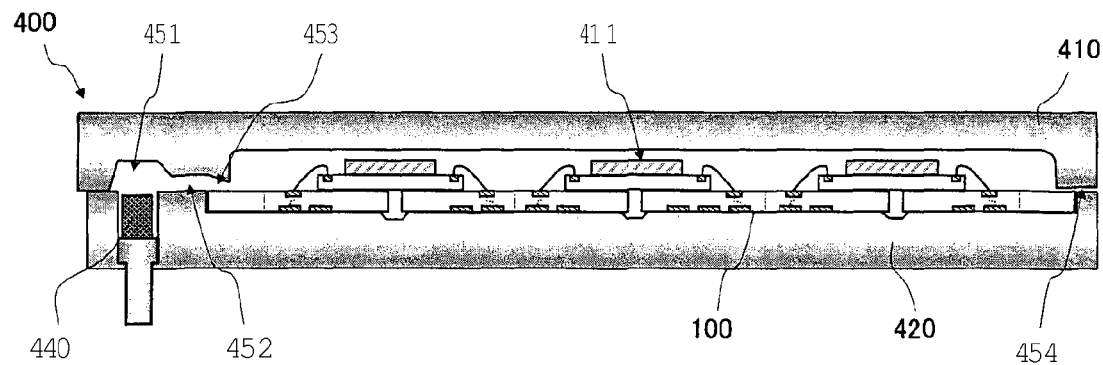

Next, as shown in FIG. 4B, the upper mold 410 and the lower mold 420 are clamped under pressure. At the time, spaces are left for culls 451, runners 452, gates 453, the cavity 411, and air vents 454.

Figure 4C:
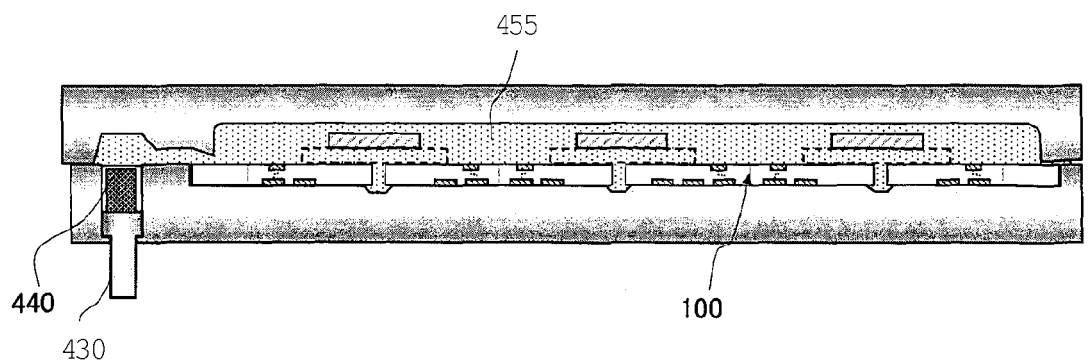
Figure 4D:
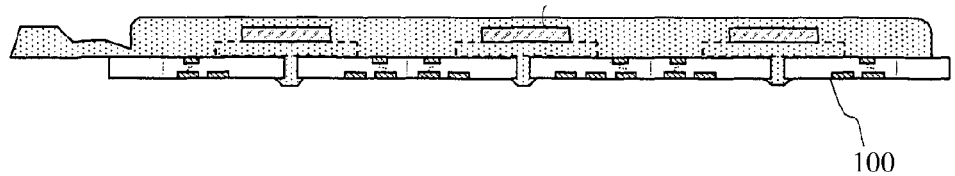

Subsequently, as shown in FIG. 4C, the material tablet 440 is compressed and melted by the plunger 430, so that the molten resin 455 is pressed into the cavity 411 through the culls 451, the runners 452, and the gates 453 under pressure. The molten resin 455 flows from the gates 453 toward the air vents 454, that is, from the left to the right in FIG. 4C. Thus, the molten resin 455 is filled into the cavity.

In FIG. 4C, the base wiring substrate 100 is disposed differently than that of FIG. 3C. Specifically, the longitudinal direction of the first semiconductor device 30-1 is the same as the direction from the left to right of the paper of FIG. 4C. The overhang portions of the second semiconductor device 30-2 project frontward and rearward from the paper of FIG. 4C. Therefore, the molten resin 455 flows in a direction that is roughly perpendicular to the direction in which the overhang portions project. In other words, the molten resin 455 flows roughly along the long sides of the first semiconductor chip 30-1. Accordingly, if sufficiently large gaps are formed between the overhang portions of the second semiconductor device 30-2 and the base wiring substrate 100, the molten resin 4SS can readily be filled in those gaps. However, thickness reduction of a semiconductor chip tends to narrow gaps between the overhang portions of the second semiconductor device 30-2 and the base wiring substrate 100. Thus, the difficulty of the molten resin 4SS to enter those gaps is increasing.

According to the present embodiment, even if narrow gaps are formed between the overhang portions and the base wiring substrate 100, the vent portions 27 allow the pressurized molten resin 4SS to enter those gaps with ease.

FIGS. SA to SC show how the molten resin 4SS enters the gap between the overhang portion and the base wiring substrate 100.

As shown in FIG. SA, when a narrow gap is formed between the overhang portion and the base wiring substrate 100, it is difficult for the molten resin 4SS to flow into the gap. As a result, a void SOO is formed below the overhang portion.

Thereafter, as the pressure in the cavity 411 increases, the molten resin 4SS enters a space below the overhang portion. Air in the void SOO is discharged through the vent portion 27 into the flow cavity 422. Accordingly, as shown in FIGS. SB and SC, the molten resin 4SS is allowed to flow from the vent portion 27 to the flow cavity. Therefore, the sealing member S0-1 is filled in the vent portion 27, so that the opening portion of the vent portion 27 is filled with the sealing member S0-1.

Thereafter, the upper mold 410 and the lower mold 420 are opened. Thus, there can be obtained the base wiring substrate 100 in which the sealing member S0-1 has been formed on the entire surface of the base wiring substrate 100 as shown in FIG. 40.

As described above, in the present embodiment, the vent portions 27 are formed below the overhang portions of the second semiconductor chip 30-2. Therefore, even if a void is generated below the overhang portions during molding as shown in FIG. SA because narrow gaps are formed below the overhang portions due to reduction in thickness of the first semiconductor chip 30-1, air of the void can be released from the vent portions 27 as shown in FIG. 58. Thus, generation of voids can be suppressed below the overhang portions. Therefore, package cracks resulting from void development upon temperature increase of the semiconductor device such as subsequent reflowing can be suppressed, so that the reliability of the semiconductor device can be improved.

Next, a semiconductor device according to a second embodiment of the present invention will be described with reference to FIG. 6.

Figure 6:
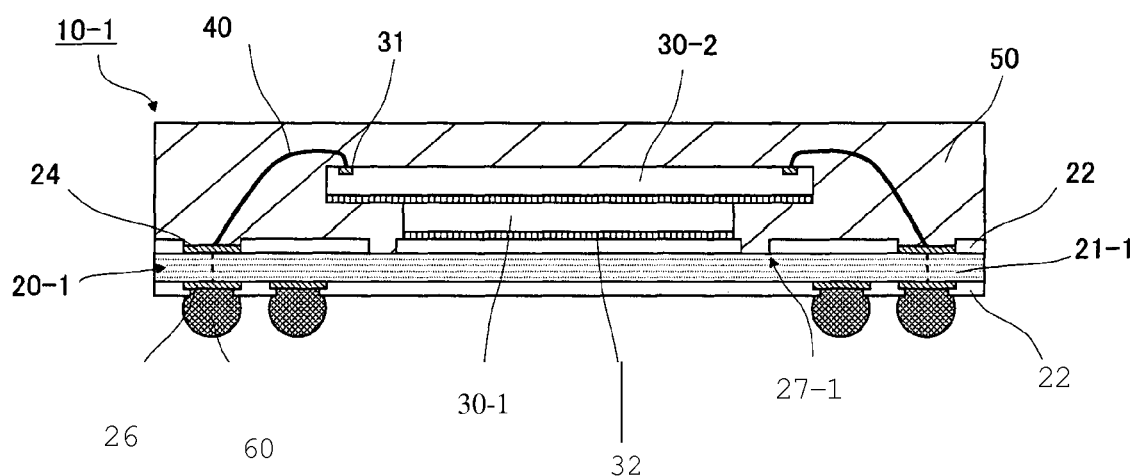
FIG. 6 is a vertical cross-sectional view showing an outlined configuration of a semiconductor device according to a second embodiment of the present invention.

FIG. 6 is a cross-sectional view showing an outlined configuration of a semiconductor device 10-1 according to the present embodiment. The illustrated semiconductor device 10-1 differs from the semiconductor device 10 of the first embodiment in that it has a wiring substrate 20-1 different from the wiring substrate 20.

The wiring substrate 20-1 differs from the wiring substrate 20 of the first embodiment in that it includes an insulating base member 21-1 having air permeability. The insulating base member 21-1 is formed of a porous material or other materials having air permeability. For example, Gore-Tex (trademark of WL Gore & Associates, Inc.) may be used for the insulating base member 21-1.

Figure 7A:
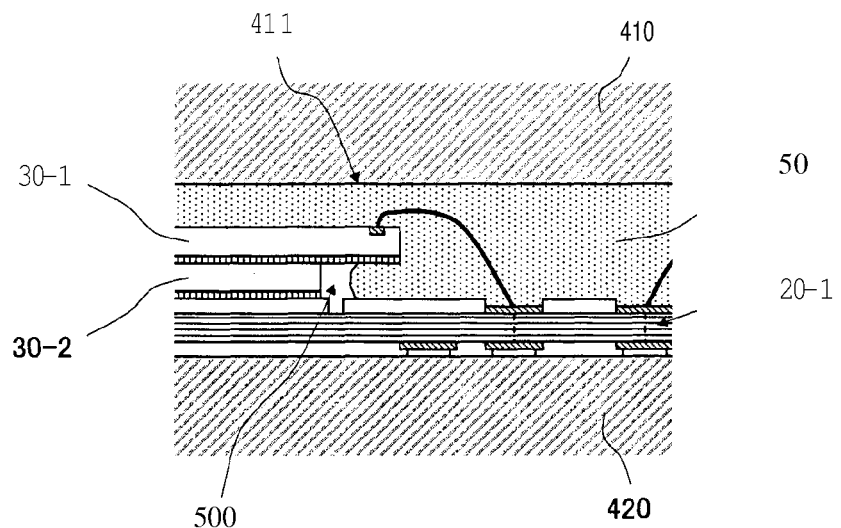
FIGS. 7A to 7C are enlarged views of a primary portion of the semiconductor device for explaining a filling process in a manufacturing process of the semiconductor device shown in FIG. 6.
Figure 7B:
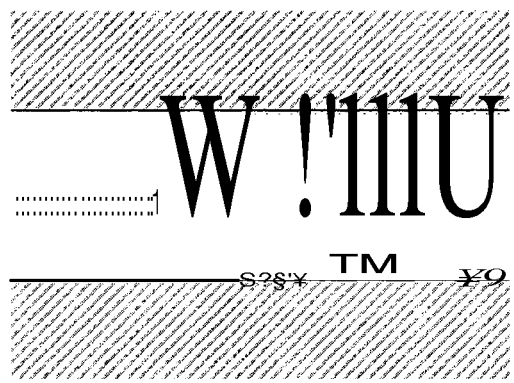
Figure 7C:
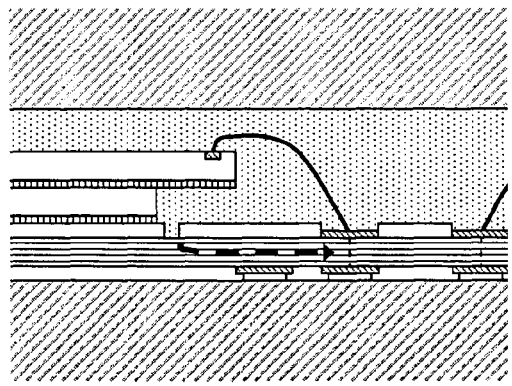
Figure 8A:
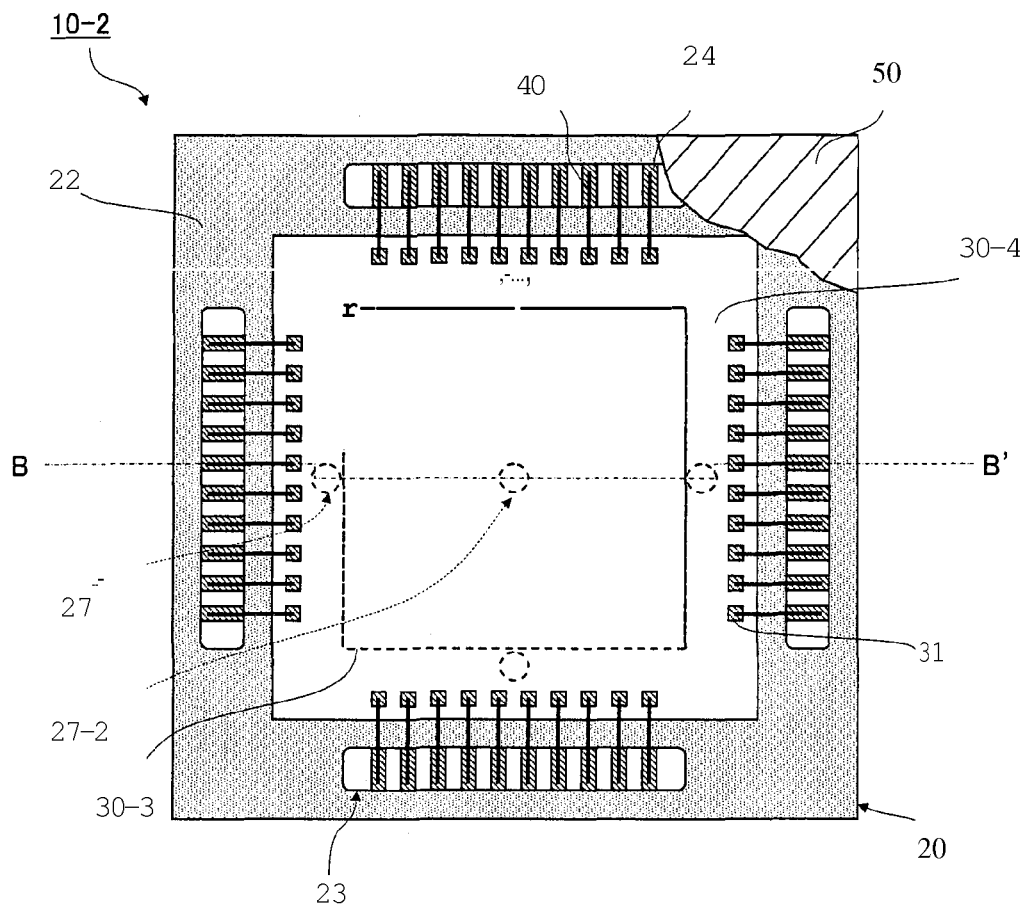
FIG. 8A is a plan view showing an outlined configuration of a semiconductor device according to a third embodiment of the present invention.
Figure 8B:
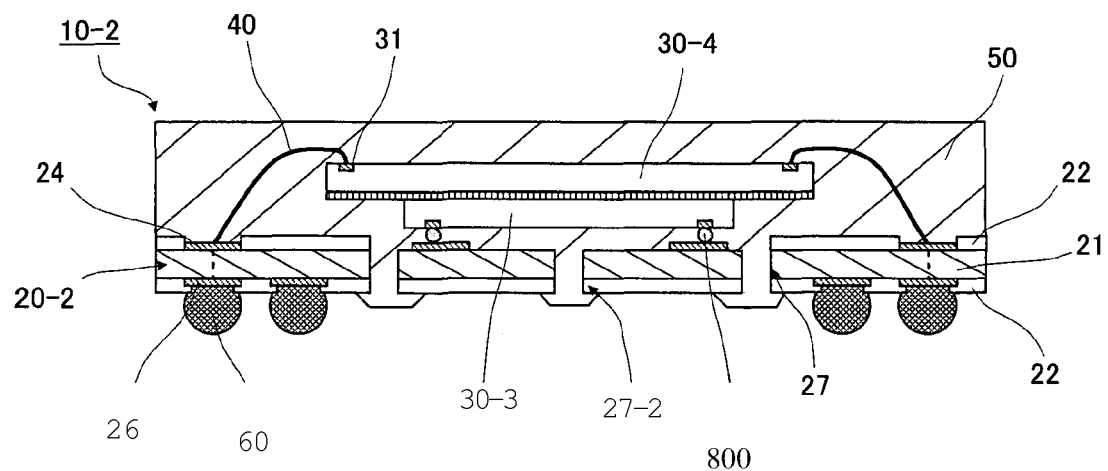
FIG. 8B is a cross-sectional view taken along line B-B' of FIG. BA.

Solder resist films 22 are formed on the wiring substrate 20-1. As with the first embodiment, the solder resist film 22 has opening portions formed therein for air vent, which are located within regions facing overhang portions of a second semiconductor chip 30-2. Formation of the opening portions for air vent in the solder resist film 22 allows the insulating base member 21-1 itself to serve as an air passage. In other words, the insulating base member 21-1, which communicates with the opening portions formed in the solder resist film 22, constitutes a vent portion 27-1. With this configuration, air can be discharged from the opening portions of the solder resist film 22, which are located below the overhang portions of the second semiconductor chip 30-2, through the insulating base member 21-1 having air permeability to side surfaces of the wiring substrate 20-1. FIGS. 7A to 7C show, by arrows, how air is discharged during molding.

In the present embodiment, even if narrow gaps are formed below the overhang portions of the second semiconductor chip 30-2 due to reduction in thickness of the first semiconductor chip 30-1, generation of voids can be suppressed below the overhang portions the second semiconductor chip 30-2 as with the first embodiment. Therefore, the reliability of the semiconductor device can be improved.

Furthermore, in the second embodiment, air can be discharged through the insulating base member 21-1 of the wiring substrate 20-1 to the side surfaces of the wiring substrate 20-1. Therefore, no sealing resin flows onto a rear face of the wiring substrate 20-1. Accordingly, the lower mold 420 of the molding tool does not need to have any flow cavities formed therein. As a result, a common lower mold can be used to manufacture semiconductor devices having different configurations. Thus, it is not necessary to change lower molds for different products. Therefore, the manufacturing cost can be reduced.

In the above embodiments, the opening portions are formed in portions of the solder resist film 22 that are located below the overhang portions. Nevertheless, the opening portions may be configured in any manner as long as the semiconductor device can have air permeability. For example, the opening portions may be configured in a meshed manner.

A semiconductor device according to a third embodiment of the present invention will be described with reference to FIGS. BA and 88.

FIG. BA is a plan view showing an outlined configuration of a semiconductor device 10-2 according to the third embodiment of the present invention, and FIG. 88 is a cross-sectional view taken along line 8-8'. In FIG. BA, most part of the sealing member 50 is omitted from the illustration.

The illustrated semiconductor device 10-2 includes a first semiconductor chip 30-3 having a substantially square shape and a second semiconductor chip 30-4 having a substantially square shape. The second semiconductor chip 30-4 is larger in size than the first semiconductor chip 30-3.

The first semiconductor chip 30-3 is mounted on electrode pads formed on a first surface of the wiring substrate 20-2 via bump electrodes 800 by flip chip bonding. The bump electrodes 800 provide a certain gap between the first semiconductor chip 30-3 and the wiring substrate 20-2.

The second semiconductor chip 30-4 is stacked and mounted on a rear face of the first semiconductor chip 30-3 in a face-up manner by an adhesive member. The second semiconductor chip 30-4 is arranged such that the center of the second semiconductor chip 30-4 is substantially aligned with the center of the first semiconductor chip 30-3 and that sides of the second semiconductor chip 30-4 are parallel to sides of the first semiconductor chip 30-3. The chip size of the second semiconductor chip 30-4 is larger than that of the first semiconductor chip 30-3. Therefore, the four sides of the second semiconductor chip 30-4 project outward from edges of the first semiconductor chip 30-3 so as to form overhang portions. In the present embodiment, a vent portion 27 is formed in each of areas of the wiring substrate 20-2 that are located below those four overhang portions of the second semiconductor chip 30-4.

Furthermore, in the present embodiment, another vent portion 27-2 is formed in an area (second area) of the wiring substrate 20-2 that overlaps the first semiconductor chip 30-3. Specifically, the vent portion 27-2 is formed in the wiring substrate 20-2 at a position located below the center of the first semiconductor chip 30-3, which is mounted on the wiring substrate 20-2 by flip chip bonding. As with the vent portions 27, the vent portion 27-2 also includes an opening portion (second opening portion) formed in the insulation film 22 and a through hole communicating with the opening portion.

In the present embodiment, even if narrow gaps are formed below the overhang portions due to reduction in thickness of the first semiconductor chip 30-3, generation of voids can be suppressed below the overhang portions of the second semiconductor chip 30-4 by formation of the vent portions 27 as with the first embodiment. Therefore, the reliability of the semiconductor device can be improved.

Furthermore, in the present embodiment, the vent portion 27-2 is formed below the first semiconductor chip 30-3 mounted by flip chip bonding. Therefore, generation of voids can be suppressed in the gap between the first semiconductor chip 30-3 and the wiring substrate 20-2.

Moreover, in the present embodiment, the solder resist film 22 is removed from an area overlapping the first semiconductor chip 30-3. Therefore, the gap can be enlarged between the first semiconductor chip 30-3 and the wiring substrate 20-2. Thus, the filling facility of the sealing resin can be improved.

Figure 9A:
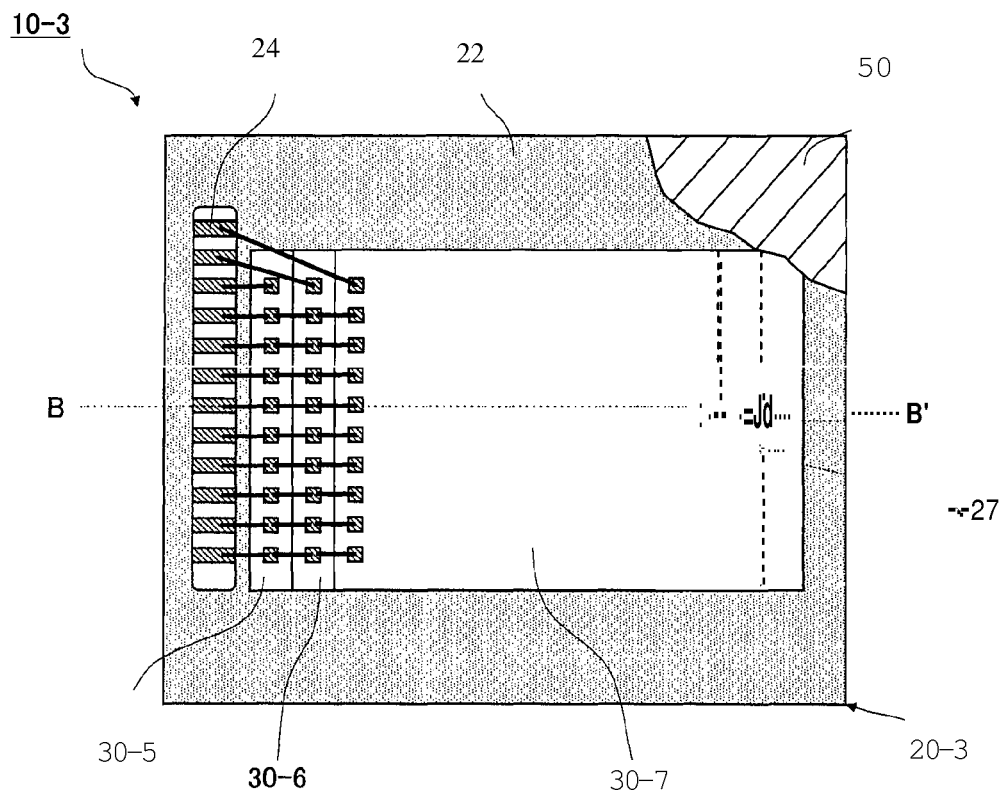
FIG. 9A is a plan view showing still another variation of the semiconductor device according to the first embodiment of the present invention.
Figure 9B:
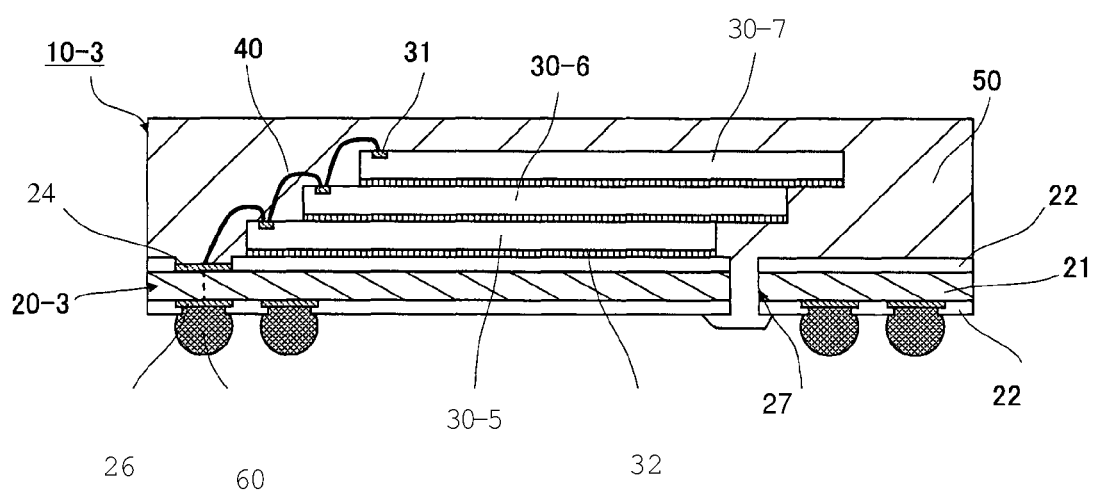
FIG. 9B is a cross-sectional view taken along line B-B' of FIG. 9A.

While the invention has been described above in connection with several preferred embodiments thereof, it will be appreciated by those skilled in the art that those embodiments are provided solely for illustrating the invention, and should not be relied upon to construe the appended claims in a limiting sense. As a matter of course, it should be understood that various changes may be made without departing from the spirit of the present invention. For example, in the first embodiment, the semiconductor device has a plurality of semiconductor chips stacked crosswise. Each of the semiconductor chips has a rectangular shape and also has a plurality of electrode pads arranged along short sides thereof. The vent portions are formed below the overhang portions. Nevertheless, the present invention is applicable to any semiconductor device as long as an upper semiconductor chip overhangs a lower semiconductor chip. For example, as shown in FIGS. 9A and 9B, a plurality of semiconductor chips 30-5, 30-6, and 30-7 in a semiconductor device 10-3 may be stacked such that those semiconductor chips 30-5, 30-6, and 30-7 are shifted along one direction (along long sides or short sides) with their longitudinal directions being in parallel to each other. In this case, a vent portion 27 may be formed in an area located below the overhang portions. In FIG. 9A, most part of the sealing member 50 is omitted from the illustration.

In the first embodiment, the present invention is applied to a semiconductor device including the same memory chips stacked so that the overhang portions are formed. Nevertheless, the present invention is applicable to any semiconductor device including a plurality of semiconductor chips stacked so that one or more overhang portions are formed. Therefore, the semiconductor device may include different types of semiconductor chips, e.g., a memory chip and a logic chip.

All or part of the above embodiments can be described as in the following notes. Nevertheless, the present invention is not limited to those notes.

(Note 1) A method of manufacturing a device, the method comprising: defining, on a surface of a substrate, a chip mount area over which a first semiconductor chip is to be mounted; forming an air passage in the substrate so that an opening portion is formed at a certain location of the surface of the substrate other than the chip mount area; mounting the first semiconductor chip over the chip mount area; stacking a second semiconductor chip over the first semiconductor chip so that an overhang portion is formed so that the opening portion overlaps the overhang portion; forming a sealing member on the substrate by molding so that the first semiconductor chip and the second semiconductor chip are covered with the sealing member; and allowing a molten resin of the sealing member to enter the opening portion.

(Note 2) The method as recited in Note 1, wherein the forming of the air passage includes forming a through hole at the certain location of the substrate so as to form the air passage.

(Note 3) The method as recited in Note 1, wherein the substrate has a base member formed of a material having air permeability and an insulation film formed on a surface of the base member, the opening portion is formed in the insulation film so that the base member serves as part of the air passage.

This application is based upon and claims the benefit of priority from Japanese paten application No. 2012-184223, filed on Aug. 23, 2012, the disclosure of which is incorporated herein in its entirety by reference.

The invention claimed is:

1. A device comprising:
a substrate having a base member and an insulation film formed on a surface of the base member;
a first semiconductor chip mounted over a surface of the substrate on which the insulation film is formed;
a second semiconductor chip stacked over the first semiconductor chip so that an overhang portion is formed; and
a sealing member formed on the substrate so that the first semiconductor chip and the second semiconductor chip are covered with the sealing member,
wherein the insulation film has a first opening portion in a first area of the substrate that overlaps the overhang portion,
the base member has an air passage communicating with the first opening portion,
the first area having a rectangular shape, and
the first opening portion is formed at a central portion of the first area in a longitudinal direction of the first area and near the first semiconductor chip.

2. The device as recited in claim 1, wherein the air passage is formed by a through hole formed in the base member, and the first opening and the through hole are filled with the sealing member.

3. The device as recited in claim 1, wherein the base member is formed of a material having air permeability so that the air passage is formed within the base member.

4. The device as recited in claim 3, wherein the first opening portion is filled with the sealing member.

5. The device as recited in claim 1, wherein the first area having a rectangular shape, and a plurality of first opening portions are arranged along a longitudinal direction of the first area and near the first semiconductor chip.

6. The device as recited in claim 1, wherein the first area having a rectangular shape, the first opening portion is formed near the first semiconductor chip, and the first opening portion has a substantially rectangular shape extending along a longitudinal direction of the first area.

7. The device as recited in claim 1, wherein each of the first semiconductor chip and the second semiconductor chip is in a form of a rectangular plate, the first semiconductor chip and the second semiconductor chip are stacked such that a longitudinal direction of the first semiconductor chip is perpendicular to a longitudinal direction of the second semiconductor chip, and the overhang portion is formed by opposite ends of the second semiconductor chip in the longitudinal direction of the second semiconductor chip.

8. The device as recited in claim 1, wherein each of the first semiconductor chip and the second semiconductor chip is in a form of a rectangular plate, the first semiconductor chip and the second semiconductor chip are stacked such that a longitudinal direction of the first semiconductor chip is parallel to a longitudinal direction of the second semiconductor chip, and the overhang portion is formed by one of opposite ends of the second semiconductor chip in the longitudinal direction of the second semiconductor chip.

9. The device as recited in claim 1, wherein the first semiconductor chip is mounted over the substrate with a gap between the first semiconductor chip and the substrate, the gap is filled with the sealing member, and the insulation film has a second opening portion in a second area of the substrate that overlaps the first semiconductor chip.

10. The device as recited in claim 1, wherein the first opening portion has a diameter or a minimum width greater than a diameter of a filler included in the sealing member.

11. A device comprising:
a substrate including an upper surface and an air passage, a part of the air passage being exposed from the upper surface;
a first semiconductor chip mounted over the upper surface of the substrate, the first semiconductor chip being arranged near the part of the air passage;
a second semiconductor chip stacked over the first semiconductor chip so as to cover the part of the air passage in plan view; and
a sealing member provided over the upper surface of the substrate to cover the first semiconductor chip and the second semiconductor chip, wherein
the substrate comprises a base member and a insulation film formed on a surface of the base member, the insulation film includes an opening that is exposing the base member, the base member is formed of a material having air permeability, and the air passage is constructed by the base member and the opening of the insulating film.

12. The device as recited in claim 11, wherein the substrate includes a lower surface opposite to the upper surface, the air passage is formed by a through hole that is penetrated from the upper surface to the lower surface, and the through hole is filled with the sealing member.

13. A device comprising:
a substrate including an upper surface, a lower surface opposite to the upper surface and a through hole penetrated from the upper surface to the lower surface;
a first semiconductor chip mounted over the upper surface of the substrate, the first semiconductor chip being arranged near the through hole without covering the through hole with the first semiconductor chip;
a second semiconductor chip stacked over the first semiconductor chip, the second semiconductor chip including an overhang portion that is protruded from the first semiconductor chip so as to cover the through hole in plan view; and
a sealing resin provided over the upper surface of the substrate to cover the first semiconductor chip and the second semiconductor chip, the through hole being filled with the sealing resin, wherein
the first semiconductor chip includes a first surface that is facing toward the substrate, a second surface opposite to the first surface and a plurality of electrode pads formed on the first surface,
the substrate includes a plurality of connection pads and a second through hole penetrated from the upper surface to the lower surface, the second through hole is arranged at a location overlapping the first semiconductor chip, the second through hole is filled with the sealing resin, and
each of the electrode pads is electrically coupled to an associated one of the connection pads by a bump electrode.

14. The device as recited in claim 13, wherein the substrate includes a plurality of connection pads, the first semiconductor chip includes a first surface that is facing toward the substrate, a second surface opposite to the first surface and a plurality of electrode pads formed on the second surface, the second semiconductor chip is stacked over the first semiconductor chip so that the electrode pads expose from the second semiconductor chip, and each of the electrode pads is electrically coupled to an associated one of the connection pads by a bonding wire.

15. The device as recited in claim 13, wherein the overhang portion of the second semiconductor chip includes a peripheral edge, and the first semiconductor chip is arranged near the through hole than the peripheral edge of the overhang portion of the second semiconductor chip in plan view.

16. The device as recited in claim 13, wherein the substrate includes a second through hole penetrated from the upper surface to the lower surface, the second through hole is arranged so that the first semiconductor chip is sandwiched between the through hole and the second through hole in plan view, and the second semiconductor chip includes a second overhang portion that is protruded from the first semiconductor chip so as to cover the second through hole in plan view.

17. The device as recited in claim 14, wherein the second semiconductor chip includes a third surface that is facing toward the first semiconductor chip, a fourth surface opposite to the third surface and a plurality of second electrode pads formed on the fourth surface, and each of the second electrode pads is electrically coupled to an associated one of the connection pads by a second bonding-wire.

* * * * *